(12) United States Patent
Yokoyama et al.

(10) Patent No.: US 10,680,576 B2
(45) Date of Patent: Jun. 9, 2020

(54) PIEZOELECTRIC THIN FILM RESONATOR, FILTER, AND DUPLEXER

(71) Applicant: TAIYO YUDEN CO., LTD., Tokyo (JP)

(72) Inventors: Tsuyoshi Yokoyama, Tokyo (JP); Jiansong Liu, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 207 days.

(21) Appl. No.: 15/417,725

(22) Filed: Jan. 27, 2017

(65) Prior Publication Data
US 2017/0230031 A1 Aug. 10, 2017

(30) Foreign Application Priority Data

Feb. 5, 2016 (JP) .................................. 2016-020952

(51) Int. Cl.
*H03H 9/02* (2006.01)
*H03H 9/70* (2006.01)
(Continued)

(52) U.S. Cl.
CPC .... *H03H 9/02015* (2013.01); *H03H 9/02118* (2013.01); *H03H 9/171* (2013.01);
(Continued)

(58) Field of Classification Search
CPC ............. H03H 9/02015; H03H 9/0211; H03H 9/02118; H03H 9/171; H03H 9/173;
(Continued)

(56) References Cited

U.S. PATENT DOCUMENTS 6,191,524 B1 * 2/2001 Sasaki ................ H03H 9/02133
310/367
6,788,170 B1 9/2004 Kaitila et al.
(Continued)

FOREIGN PATENT DOCUMENTS

JP 2003-505906 A 2/2003
JP 2005-159402 A 6/2005
(Continued)

OTHER PUBLICATIONS

Japanese Office Action dated Apr. 3, 2018, in a counterpart Japanese patent application No. 2016-020952. (A machine translation (not reviewed for accuracy) attached.).
(Continued)

*Primary Examiner* — Barbara Summons
(74) *Attorney, Agent, or Firm* — Chen Yoshimura LLP

(57) ABSTRACT

A piezoelectric thin film resonator includes: a substrate; a lower electrode located on the substrate; a piezoelectric film that has a step on an upper surface thereof and is located on the lower electrode, a film thickness of the piezoelectric film inside the step being greater than a film thickness of the piezoelectric film outside the step; an upper electrode located on the piezoelectric film so that a resonance region is formed, the lower electrode and the upper electrode facing each other across the piezoelectric film in the resonance region, the resonance region including the step in plan view; and an insertion film located in the piezoelectric film, between the piezoelectric film and the lower electrode, or between the piezoelectric film and the upper electrode in at least a part of an outer peripheral region within the resonance region, and not located in a central region of the resonance region.

15 Claims, 14 Drawing Sheets

(51) Int. Cl.
  *H03H 9/17* (2006.01)
  *H03H 9/52* (2006.01)
  *H03H 9/54* (2006.01)

(52) U.S. Cl.
  CPC .............. *H03H 9/52* (2013.01); *H03H 9/54* (2013.01); *H03H 9/706* (2013.01)

(58) Field of Classification Search
  CPC ............ H03H 9/175; H03H 9/52; H03H 9/54; H03H 9/564; H03H 9/582; H03H 9/587; H03H 9/589; H03H 9/706
  USPC .......................... 333/133, 187, 189; 310/367
  See application file for complete search history.

(56) References Cited

U.S. PATENT DOCUMENTS

| | | | |
|---|---|---|---|
| 6,812,619 | B1 | 11/2004 | Kaitila et al. |
| 9,048,812 | B2 | 6/2015 | Burak et al. |
| 2002/0030424 | A1* | 3/2002 | Iwata ................. H03H 9/132 310/363 |
| 2004/0256961 | A1* | 12/2004 | Namba ................. H03H 3/04 310/365 |
| 2006/0071736 | A1 | 4/2006 | Ruby et al. |
| 2006/0103492 | A1 | 5/2006 | Feng et al. |
| 2006/0226932 | A1 | 10/2006 | Fazzio et al. |
| 2008/0174389 | A1 | 7/2008 | Mori et al. |
| 2008/0179995 | A1 | 7/2008 | Umeda et al. |
| 2008/0258842 | A1 | 10/2008 | Ruby et al. |
| 2010/0033063 | A1 | 2/2010 | Nishihara et al. |
| 2012/0299664 | A1 | 11/2012 | Hara et al. |
| 2014/0210570 | A1 | 7/2014 | Nishihara et al. |
| 2015/0130559 | A1 | 5/2015 | Yokoyama et al. |
| 2016/0142038 | A1* | 5/2016 | Taniguchi .............. H03H 9/706 333/133 |
| 2017/0033769 | A1* | 2/2017 | Yokoyama ............... H03H 9/13 |

FOREIGN PATENT DOCUMENTS

| | | | |
|---|---|---|---|
| JP | 2006-020277 | A * | 1/2006 |
| JP | 2006-109472 | A | 4/2006 |
| JP | 2006-295924 | A | 10/2006 |
| JP | 2007-006501 | A | 11/2007 |
| JP | 2010-045437 | A | 2/2010 |
| JP | 2012-244616 | A | 12/2012 |
| JP | 2014-161001 | A | 9/2014 |
| JP | 2015-095729 | A | 5/2015 |
| WO | WO 02/103900 | A1 * | 12/2002 |
| WO | 2006/129532 | A1 | 12/2006 |
| WO | 2007/052370 | A1 | 5/2007 |

OTHER PUBLICATIONS

U.S. Appl. No. 15/214,786, filed Jul. 20, 2016.

Japanese Office Action dated Jan. 30, 2018, in a counterpart Japanese patent application No. 2015-150045. (A machine translation (not reviewed for accuracy) attached. Cited in the related U.S. Appl. No. 15/214,786.).

Japanese Office Action dated Jun. 5, 2018, in a counterpart Japanese patent application No. 2015-150045. (A machine translation (not reviewed for accuracy) attached. Cited in the related U.S. Appl. No. 15/214,786.).

Ken L. Telschow et at, "Determination of Lateral Mode Dispersion from Full-field Imaging of Film Bulk Acoustic Resonator Motion", IEEE UL Transonic Simposium, 2003, p. 280-283 (Cited in the related U.S. Appl. No. 15/214,786.).

Accuratus Ceramic Corporation, "Aluminum Nitride Material Properties", www.accuratus.com. accessed on Mar. 17, 2018 (Listed by the U.S. Examiner in PTO-892 form in the related U.S. Appl. No. 15/214,786.).

Azom, "AZO Materials", www.azom.com/properties.aspx?ArticleID=I114, accessed on Mar. 17, 2018 (Listed by the U.S. Examiner in a PTO-892 form in the related U.S. Appl. No. 15/214,786.).

* cited by examiner

FIG. 13

| SAMPLE | THICKNESS T1 OF PIEZO-ELECTRIC FILM [$\mu$m] | INSERTION WIDTH W1 [$\mu$m] | MAGNITUDE OF SPURIOUS [dB] | Q-VALUE |
|---|---|---|---|---|
| SAMPLE A | 1.26 | NOT PROVIDED | −1.03 | 733 |
| SAMPLE B | 0.80 | NOT PROVIDED | −0.62 | 688 |
| SAMPLE C | 0.80 | NOT PROVIDED | −1.01 | 1332 |
| SAMPLE D | 1.26 | 2.0 | −1.75 | 1862 |
| SAMPLE E | 0.74 | NOT PROVIDED | −1.64 | 1220 |
| SAMPLE F | 1.135 | 2.0 | −2.04 | 2121 |
| SAMPLE G | 0.80 | 1.0 | −0.53 | 1908 |
| SAMPLE G | 0.80 | 1.5 | −0.71 | 2660 |
| SAMPLE H | 0.80 | 1.2 | −0.30 | 2180 |
| SAMPLE H | 0.80 | 1.4 | −0.59 | 2361 |
| SAMPLE I | 0.74 | 1.0 | −0.17 | 1460 |
| SAMPLE I | 0.74 | 1.7 | −0.53 | 2418 |
| SAMPLE J | 0.74 | 1.3 | −0.35 | 2356 |
| SAMPLE J | 0.74 | 1.5 | −0.50 | 2463 |

PIEZOELECTRIC THIN FILM RESONATOR, FILTER, AND DUPLEXER

CROSS-REFERENCE TO RELATED APPLICATION

This application is based upon and claims the benefit of priority of the prior Japanese Patent Application No. 2016-020952, filed on Feb. 5, 2016, the entire contents of which are incorporated herein by reference.

FIELD

A certain aspect of the present invention relates to a piezoelectric thin film resonator, a filter, and a duplexer.

BACKGROUND

Acoustic wave devices using piezoelectric thin film resonators are used as filters and duplexers for wireless devices such as, for example, mobile phones. The piezoelectric thin film resonator has a structure designed to have a lower electrode and an upper electrode facing each other across a piezoelectric film. A region where the lower electrode and the upper electrode face each other across the piezoelectric film is a resonance region.

Rapid diffusion of wireless systems has promoted the use of many frequency bands. As a result, the filter and the duplexer have been required to have steep skirt characteristics. One way for making the skirt characteristic steep is increasing the Q-value of the piezoelectric thin film resonator.

Japanese Patent Application Publication No. 2006-109472 (Patent Document 1) discloses a piezoelectric thin film resonator including an annulus on the surface of one of the upper electrode and the lower electrode. U.S. Pat. No. 9,048,812 (Patent Document 2) discloses a piezoelectric thin film resonator including an annulus called a bridge in the piezoelectric film. Japanese Patent Application Publication No. 2003-505906 (Patent Document 3) discloses a piezoelectric thin film resonator including a ring-shaped recess on the upper surface of the upper electrode.

The piezoelectric thin film resonators disclosed in Patent Documents 1 and 2 can reduce the leak of the acoustic wave energy from the resonance region, and improve the Q-value. The piezoelectric thin film resonator disclosed in Patent Document 2 can reduce spurious. However, the degree of improvement of the characteristics of the piezoelectric thin film resonator and the reduction of spurious are insufficient.

SUMMARY OF THE INVENTION

According to a first aspect of the present invention, there is provided a piezoelectric thin film resonator including: a substrate; a lower electrode located on the substrate; a piezoelectric film that has a step on an upper surface thereof and is located on the lower electrode, a film thickness of the piezoelectric film inside the step being greater than a film thickness of the piezoelectric film outside the step; an upper electrode that is located on the piezoelectric film so that a resonance region is formed, the lower electrode and the upper electrode facing each other across the piezoelectric film in the resonance region, the resonance region including the step in plan view; and an insertion film that is located in the piezoelectric film, between the piezoelectric film and the lower electrode, or between the piezoelectric film and the upper electrode in at least a part of an outer peripheral region within the resonance region, and is not located in a central region of the resonance region.

According to a second aspect of the present invention, there is provided a filter including the above piezoelectric thin film resonator.

According to a third aspect of the present invention, there is provided a duplexer including the above filter.

BRIEF DESCRIPTION OF THE DRAWINGS

FIG. 13 illustrates the film thickness T1 of the piezoelectric film, the insertion width W1, the magnitude of spurious, and the Q-value at the antiresonant frequency of each sample.

DETAILED DESCRIPTION

Hereinafter, embodiments of the present invention will be described with reference to the accompanying drawings.

First Embodiment

Figure 1A:
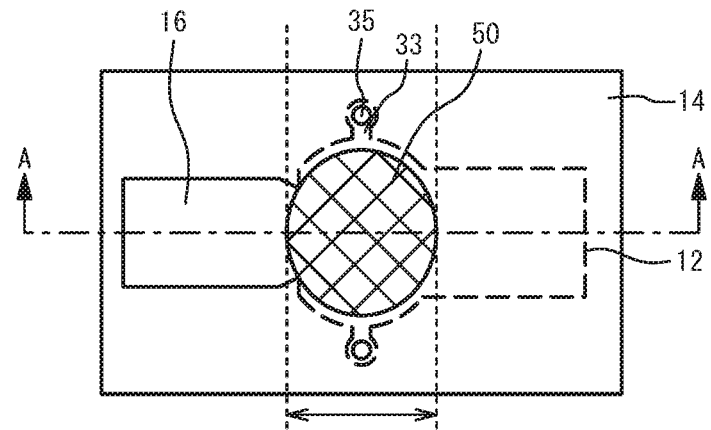
FIG. 1A is a plan view of a piezoelectric thin film resonator in accordance with a first embodiment.
Figure 1B:
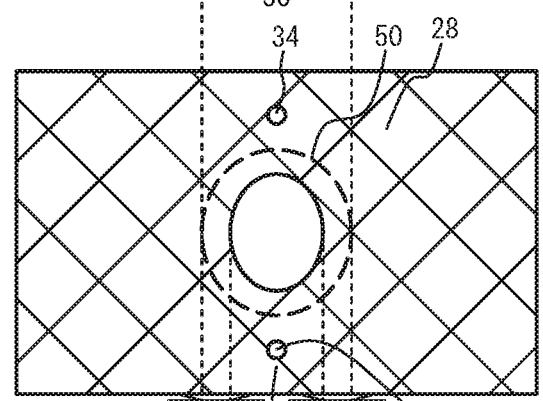
FIG. 1B is a plan view of an insertion film and an air gap.
Figure 1C:
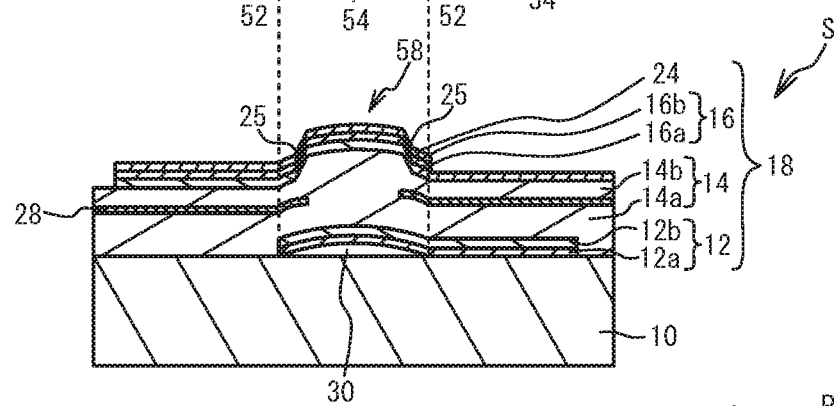
FIG. 1C and FIG. 1D are cross-sectional views taken along line A-A in FIG. 1A.
Figure 1D:
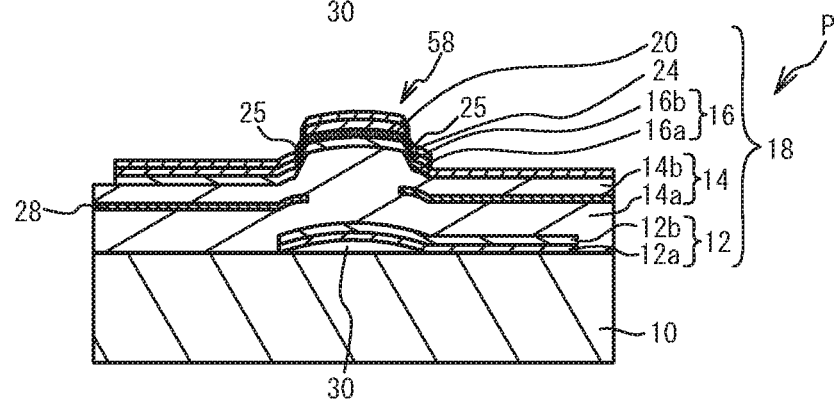

FIG. 1A is a plan view of a piezoelectric thin film resonator in accordance with a first embodiment, FIG. 1B is a plan view of an insertion film and an air gap, and FIG. 1C and FIG. 1D are cross-sectional views taken along line A-A in FIG. 1A. FIG. 1C illustrates a series resonator of, for example, a ladder-type filter, and FIG. 1D illustrates a parallel resonator of, for example, a ladder-type filter.

Figure 2A:
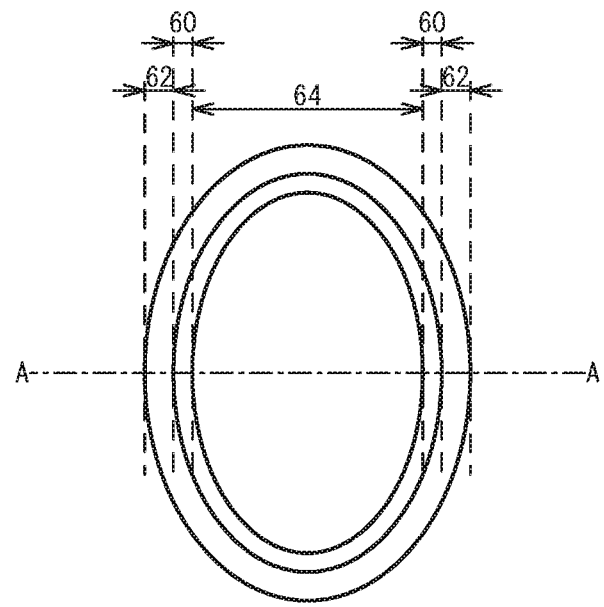
FIG. 2A is a plan view around a resonance region in the first embodiment.
Figure 2B:
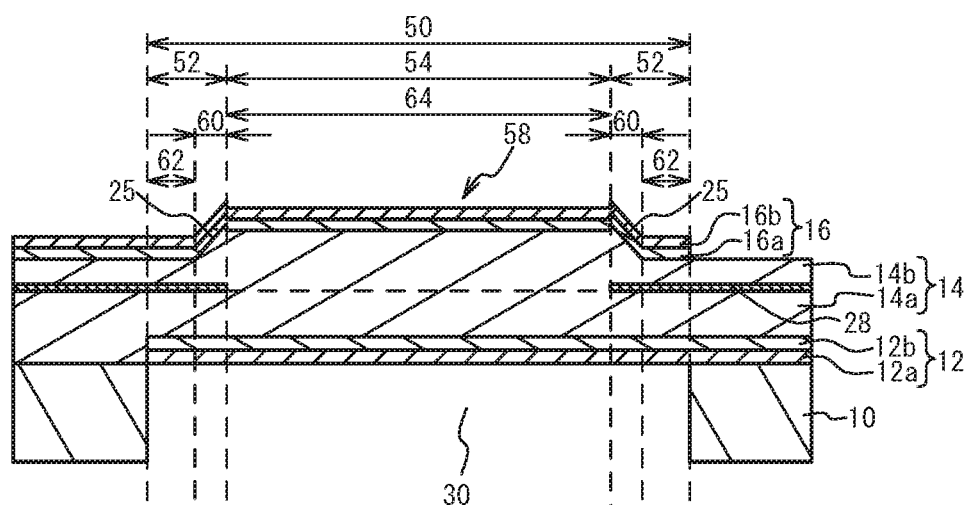
FIG. 2B and FIG. 2C are cross-sectional views around the resonance region in the first embodiment taken along line A-A.
Figure 2C:
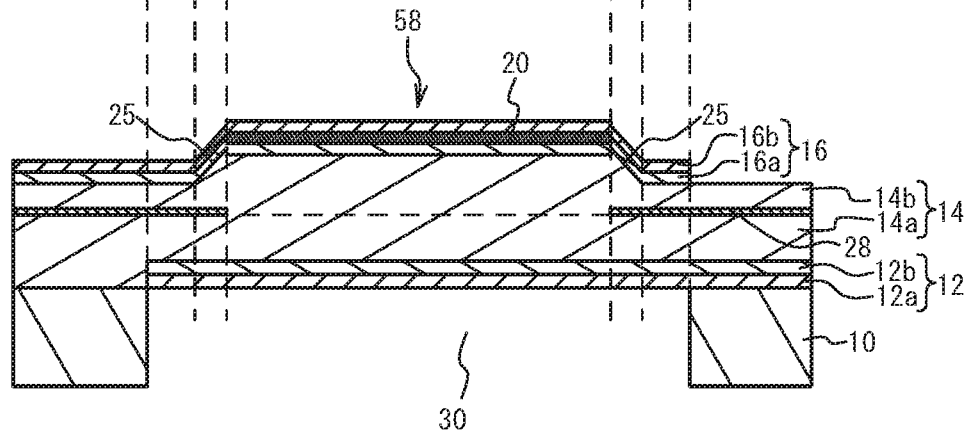

FIG. 2A is a plan view around a resonance region in the first embodiment, and FIG. 2B and FIG. 2C are cross-sectional views taken along line A-A around the resonance region in the first embodiment. FIG. 2A illustrates a step region 60, a thin film region 62, and a thick film region 64. FIG. 2B and FIG. 2C respectively illustrates, for example, a series resonator and a parallel resonator. An air gap 30 actually has a dome-shape, but FIG. 2B and FIG. 2C simplify and illustrate the upper surface of the air gap 30 as a flat surface. The same applies to the drawings hereinafter.

With reference to FIG. 1A through FIG. 1C and FIG. 2B, the structure of a series resonator S will be described. A lower electrode 12 is located on a substrate 10 that is a silicon (Si) substrate. The air gap 30 having a dome-shaped bulge is formed between the flat principal surface of the substrate 10 and the lower electrode 12. The dome-shaped bulge is a bulge with a shape in which the height of the air gap 30 is low in the periphery of the air gap 30 and increases at closer distances to the center of the air gap 30, for example. The lower electrode 12 includes a lower layer 12a and an upper layer 12b. The lower layer 12a is formed of, for example, a chrome (Cr) film, and the upper layer 12b is formed of, for example, a ruthenium (Ru) film.

Located on the lower electrode 12 is a piezoelectric film 14 mainly composed of aluminum nitride (AlN) having the main axis in the (002) direction. The piezoelectric film 14 includes a lower piezoelectric film 14a and an upper piezoelectric film 14b. A protrusion portion 58 is formed on the upper surface of the piezoelectric film 14. The film thickness of the upper piezoelectric film 14b in the thin film region 62 is less than the film thickness of the upper piezoelectric film 14b in the thick film region 64. In the step region 60, a slanted step 25 is formed on the upper surface of the upper piezoelectric film 14b. An insertion film 28 is located between the lower piezoelectric film 14a and the upper piezoelectric film 14b.

An upper electrode 16 is located on the piezoelectric film 14 so as to have a region (a resonance region 50) in which the upper electrode 16 faces the lower electrode 12 across the piezoelectric film 14. The resonance region 50 has an elliptical shape, and is a region where the acoustic wave in the thickness extension mode resonates. The upper electrode 16 includes a lower layer 16a and an upper layer 16b. The lower layer 16a is formed of, for example, a Ru film, and the upper layer 16b is formed of, for example, a Cr film.

A silicon oxide film as a frequency adjusting film 24 is formed on the upper electrode 16. A multilayered film 18 in the resonance region 50 includes the lower electrode 12, the piezoelectric film 14, the upper electrode 16, and the frequency adjusting film 24. The frequency adjusting film 24 may act as a passivation film.

As illustrated in FIG. 1A, an introduction path 33 for etching a sacrifice layer is formed in the lower electrode 12. The sacrifice layer is a layer for forming the air gap 30. The vicinity of the tip of the introduction path 33 is not covered with the piezoelectric film 14, and the lower electrode 12 has a hole portion 35 at the tip of the introduction path 33. As illustrated in FIG. 1B, a hole portion 34 corresponding to the hole portion 35 is formed in the insertion film 28.

With reference to FIG. 1D and FIG. 2C, the structure of a parallel resonator P will be described. The parallel resonator P differs from the series resonator S in that a mass load film 20 formed of a titanium (Ti) layer is located between the lower and upper layers 16a and 16b of the upper electrode 16. Accordingly, the multilayered film 18 includes the mass load film 20 formed across the entire surface in a central region 54 in addition to the multilayered film of the series resonator S. Other structures are the same as those of the series resonator S illustrated in FIG. 1C and FIG. 2B, and the description thereof is omitted.

The difference in resonant frequency between the series resonator S and the parallel resonator P is adjusted with the film thickness of the mass load film 20. The resonant frequency of each of the series resonator S and the parallel resonator P is adjusted with the film thickness of the corresponding frequency adjusting film 24.

A piezoelectric thin film resonator with a resonant frequency of 2 GHz will be structured as follows. The lower layer 12a of the lower electrode 12 is a Cr film with a film thickness of 100 nm, and the upper layer 12b is a Ru film with a film thickness of 200 nm. The piezoelectric film 14 is an AlN film. The film thickness of the piezoelectric film 14 is 1100 nm in the thick film region 64 and 600 nm in the thin film region 62. The insertion film 28 is a silicon oxide ($SiO_2$) film with a film thickness of 125 nm. The insertion film 28 is located in the middle of the piezoelectric film 14 in the film thickness direction. The lower layer 16a of the upper electrode 16 is a Ru film with a film thickness of 230 nm, and the upper layer 16b is a Cr film with a film thickness of 50 nm. The frequency adjusting film 24 is a silicon oxide film with a film thickness of 50 nm. The mass load film 20 is a Ti film with a film thickness of 120 nm. The film thickness of each layer can be appropriately configured to achieve desired resonance characteristics.

As illustrated in FIG. 1B, the insertion film 28 is located in an outer peripheral region 52 within the resonance region 50 but is not located in the central region 54. The outer peripheral region 52 is a region that is located within the resonance region 50, includes the outer periphery of the resonance region 50, and is located along the outer periphery. The outer peripheral region 52 has, for example, a strip-shape, or a ring-shape. The central region 54 is a region that is located within the resonance region 50 and includes the center of the resonance region 50. The center may not be necessarily a geometric center.

As described in Patent Document 2, the insertion film 28 preferably has a Young's modulus less than that of the piezoelectric film 14. When the insertion film 28 and the piezoelectric film 14 have approximately the same density, since the Young's modulus correlates with the acoustic impedance, the acoustic impedance of the insertion film 28 is preferably less than the piezoelectric film 14. This structure can improve the Q-value. In addition, when the insertion film 28 is formed of a metal film, the effective electromechanical coupling coefficient can be improved. Furthermore, to make the acoustic impedance of the insertion film 28 less than that of the piezoelectric film 14, when the piezoelectric film 14 is mainly composed of aluminum nitride, the insertion film 28 is preferably formed of an Al film, a gold (Au) film, a copper (Cu) film, a Ti film, a platinum (Pt) film, a tantalum (Ta) film, a Cr film, or a silicon oxide film. Especially, considering the Young's modulus, the insertion film 28 is preferably formed of an Al film or a silicon oxide film.

As illustrated in FIG. 2A through FIG. 2C, the thin film region 62 is located around the outer periphery in the resonance region 50, while the thick film region 64 is located around the center of the resonance region 50. The thick film region 64 coincides with the central region 54 in which the insertion film 28 is not formed. The thick film region 64 may not necessarily coincide with the central region 54. The thin film region 62 is a region that is located within the resonance region 50, includes the outer periphery of the resonance region 50, and is located along the outer periphery. A region other than the resonance region 50 is also the thin film region 62. The thin film region 62 has, for example, a strip-shape, or a ring-shape. The step region 60 is a region located between the thin film region 62 and the thick film region 64.

The substrate 10 may be a quartz substrate, a glass substrate, a ceramic substrate, or a GaAs substrate instead of a Si substrate. The lower electrode 12 and the upper electrode 16 may be made of a single-layer film of Al, Ti, Cu, molybdenum (Mo), tungsten (W), Ta, Pt, rhodium (Rh), or iridium (Ir), or a multilayered film of at least two of them instead of Ru and Cr. For example, the lower layer 16a of the upper electrode 16 may be made of Ru, and the upper layer 16b may be made of Mo.

The piezoelectric film 14 may be made of zinc oxide (ZnO), lead zirconate titanate (PZT), or lead titanate (PbTiO$_3$) instead of aluminum nitride. Alternatively, for example, the piezoelectric film 14 may be mainly composed of aluminum nitride, and contain another element for improving resonance characteristics or for improving piezoelectricity. For example, the use of scandium (Sc), a divalent element and a quadrivalent element, or a divalent element and a pentavalent element as additive elements improves the piezoelectricity of the piezoelectric film 14. Thus, the effective electromechanical coupling coefficient of the piezoelectric thin film resonator can be improved. The divalent element is, for example, calcium (Ca), magnesium (Mg), strontium (Sr), or zinc (Zn). The quadrivalent element is, for example, Ti, zirconium (Zr), or hafnium (Hf). The pentavalent element is, for example, Ta, niobium (Nb), or vanadium (V). Furthermore, the piezoelectric film 14 may be mainly composed of aluminum nitride and contain boron (B).

The frequency adjusting film 24 may be made of a silicon nitride film or aluminum nitride instead of a silicon oxide film. The mass load film 20 may be made of a single-layer film of Ru, Cr, Al, Cu, Mo, W, Ta, Pt, Rh, or Ir instead of Ti. Alternatively, the mass load film 20 may be made of, for example, an insulating film made of metal nitride such as silicon nitride or metal oxide such as silicon oxide. The mass load film 20 may be formed under the lower electrode 12, between the layers of the lower electrode 12, on the upper electrode 16, between the lower electrode 12 and the piezoelectric film 14, or between the piezoelectric film 14 and the upper electrode 16 instead of between the layers of the upper electrode 16 (between the lower and upper layers 16a and 16b). The mass load film 20 may be larger than the resonance region 50 as long as the mass load film 20 is formed so as to include the resonance region 50.

Figure 3A:
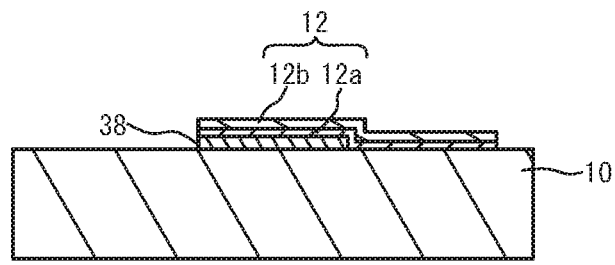
FIG. 3A through FIG. 3C are cross-sectional views (No. 1) illustrating a method of fabricating a series resonator of the first embodiment.

FIG. 3A through FIG. 4C are cross-sectional views illustrating a method of fabricating a series resonator of the first embodiment. As illustrated in FIG. 3A, a sacrifice layer 38 for forming an air gap is formed on the substrate 10 having a flat principal surface. The sacrifice layer 38 has a film thickness of, for example, 10 to 100 nm, and is made of a material selected from materials such as magnesium oxide (MgO), ZnO, germanium (Ge), or silicon oxide (SiO$_2$) that easily dissolves in an etching liquid or an etching gas. Then, the sacrifice layer 38 is patterned into a desired shape by photolithography and etching. The shape of the sacrifice layer 38 corresponds to the planar shape of the air gap 30, and includes, for example, a region to be the resonance region 50. Then, the lower layer 12a and the upper layer 12b as the lower electrode 12 are formed on the sacrifice layer 38 and the substrate 10. The sacrifice layer 38 and the lower electrode 12 are formed by, for example, sputtering, vacuum evaporation, or Chemical Vapor Deposition (CVD). Then, the lower electrode 12 is patterned into a desired shape by photolithography and etching. The lower electrode 12 may be formed by liftoff.

Figure 3B:
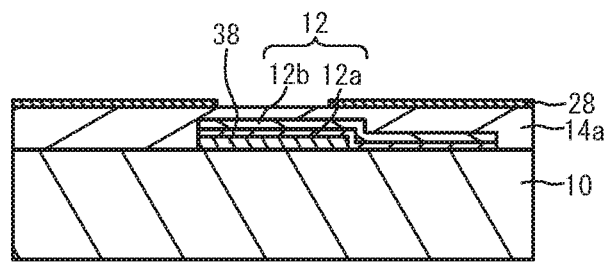

As illustrated in FIG. 3B, the lower piezoelectric film 14a is formed on the lower electrode 12 and the substrate 10 by, for example, sputtering, vacuum evaporation, or CVD. The insertion film 28 is formed on the lower piezoelectric film 14a by, for example, sputtering, vacuum evaporation, or CVD. The insertion film 28 is then patterned into a desired shape by photolithography and etching. The insertion film 28 may be formed by liftoff.

Figure 3C:
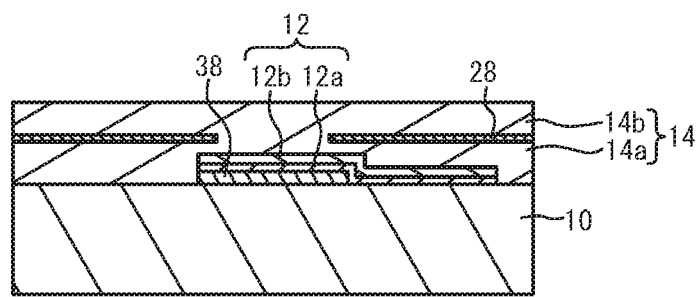

As illustrated in FIG. 3C, the upper piezoelectric film 14b is formed by, for example, sputtering, vacuum evaporation, or CVD. The lower piezoelectric film 14a and the upper piezoelectric film 14b form the piezoelectric film 14.

Figure 4A:
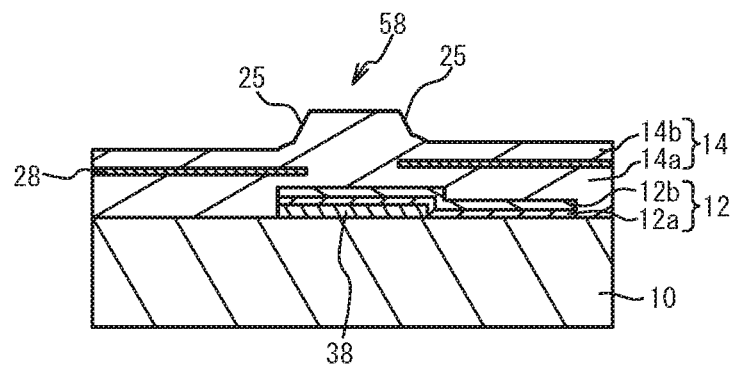
FIG. 4A through FIG. 4C are cross-sectional views (No. 2) illustrating the method of fabricating the series resonator of the first embodiment.

As illustrated in FIG. 4A, the upper piezoelectric film 14b in the region corresponding to the thin film region 62 is thinned by photolithography and etching. The region that is not etched forms the thick film region 64. The step 25 is formed in the region to be the step region 60. Accordingly, the protrusion portion 58 is formed.

Figure 4B:
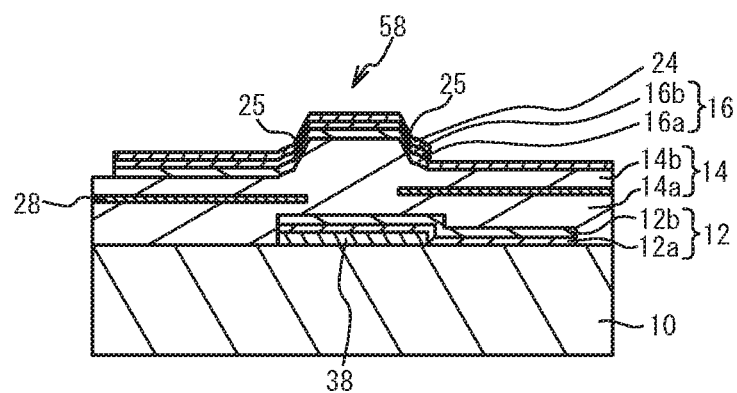

As illustrated in FIG. 4B, the upper electrode 16 is patterned into a desired shape by photolithography and etching. The upper electrode 16 may be formed by liftoff. Since the step 25 is slanted, the disconnection of the upper electrode 16 by the step 25 can be reduced.

In the parallel resonator illustrated in FIG. 1D and FIG. 2C, after the lower layer 16a of the upper electrode 16 is formed, the mass load film 20 is formed by, for example, sputtering, vacuum evaporation, or CVD. The mass load film 20 is patterned into a desired shape by photolithography and etching. Then, the upper layer 16b of the upper electrode 16 is formed.

The frequency adjusting film 24 is formed by, for example, sputtering or CVD. The frequency adjusting film 24 is patterned into a desired shape by photolithography and etching.

Figure 4C:
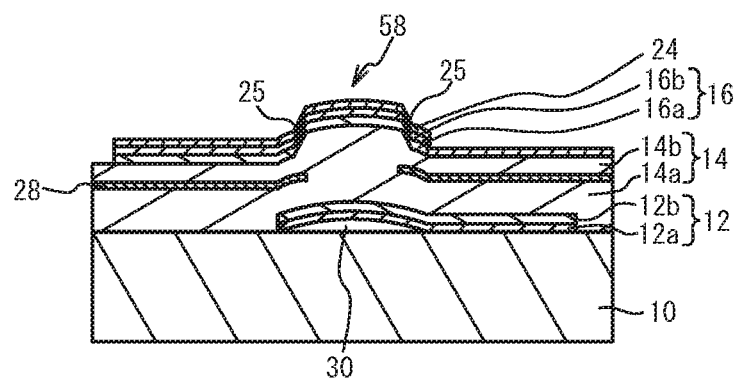

As illustrated in FIG. 4C, through the hole portion 35 and the introduction path 33 (see FIG. 1A), an etching liquid for the sacrifice layer 38 is introduced into the sacrifice layer 38 under the lower electrode 12. This process removes the sacrifice layer 38. A substance for etching the sacrifice layer 38 is preferably a substance that does not etch materials constituting the resonator except the sacrifice layer 38. Especially, a substance for etching is preferably a substance that does not etch the lower electrode 12 with which the substance for etching comes in contact. The stress of the multilayered film 18 (see FIG. 1C and FIG. 1D) is set to a compression stress. This configuration causes the multilayered film 18 to bulge out to the opposite side from the substrate 10 so as to separate from the substrate 10 when the sacrifice layer 38 is removed. The air gap 30 with a dome-shaped bulge is formed between the lower electrode 12 and the substrate 10. The above-described processes complete the series resonator S illustrated in FIG. 1A and FIG. 1C, and the parallel resonator P illustrated in FIG. 1A and FIG. 1D.

In the first embodiment, the piezoelectric film 14 includes the step 25 on the upper surface in the resonance region 50. The film thickness of the piezoelectric film 14 located outside the step 25 and in the resonance region 50 is less than the film thickness of the piezoelectric film 14 located inside the step 25. The upper electrode 16 is located on the side surface of the step 25. As described, in addition to the insertion film 28, the step is formed in the resonance region 50. The insertion film 28 can improve the characteristics of the piezoelectric thin film resonator. Furthermore, synergetic effect of the insertion film 28 and the step 25 can reduce spurious.

Figure 5A:
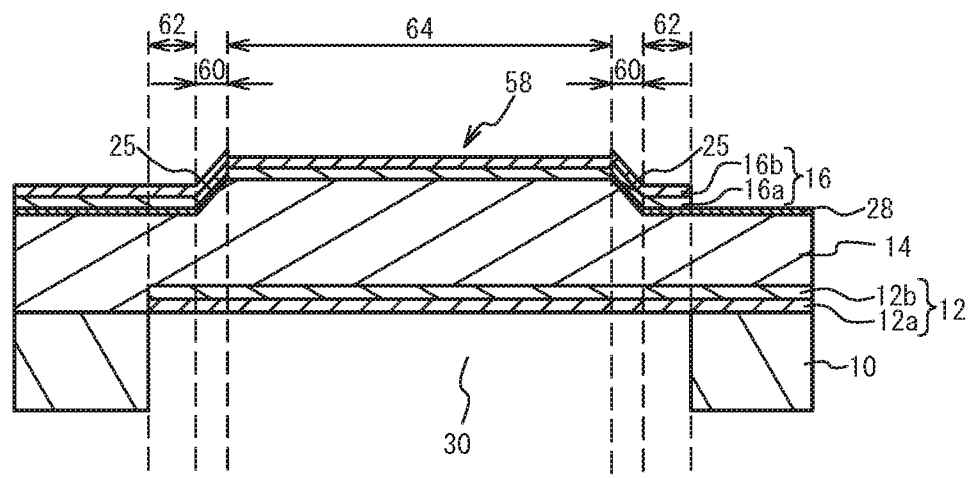
FIG. 5A through FIG. 5C are cross-sectional views around the resonance region in first through third variations of the first embodiment, respectively.

FIG. 5A through FIG. 6B are cross-sectional views around the resonance region in first through fifth variations of the first embodiment, respectively. As illustrated in FIG. 5A, in the thin film region 62 and the step region 60, the insertion film 28 is interposed between the piezoelectric film 14 and the upper electrode 16. Other structures are the same as those of the first embodiment, and the description thereof is thus omitted.

Figure 5B:
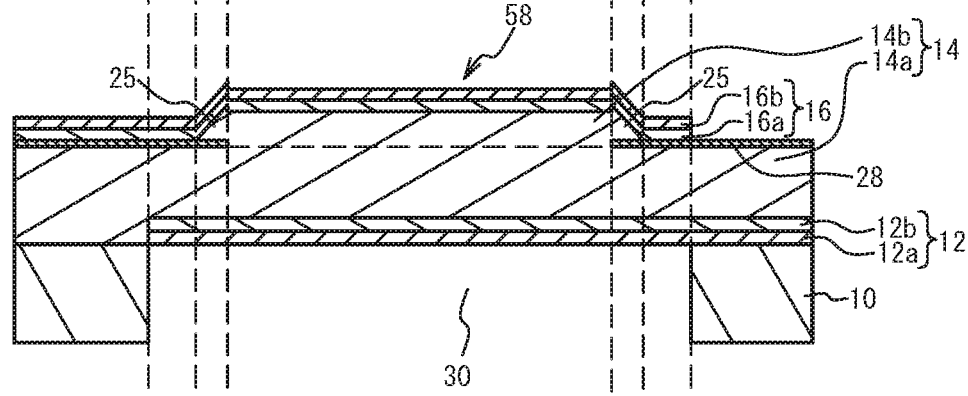

As illustrated in FIG. 5B, in the thin film region 62, the insertion film 28 is interposed between the piezoelectric film 14 and the upper electrode 16. In the step region 60, the insertion film 28 is interposed between the lower piezoelectric film 14a and the upper piezoelectric film 14b. Other structures are the same as those of the first embodiment, and the description thereof is thus omitted.

Figure 5C:
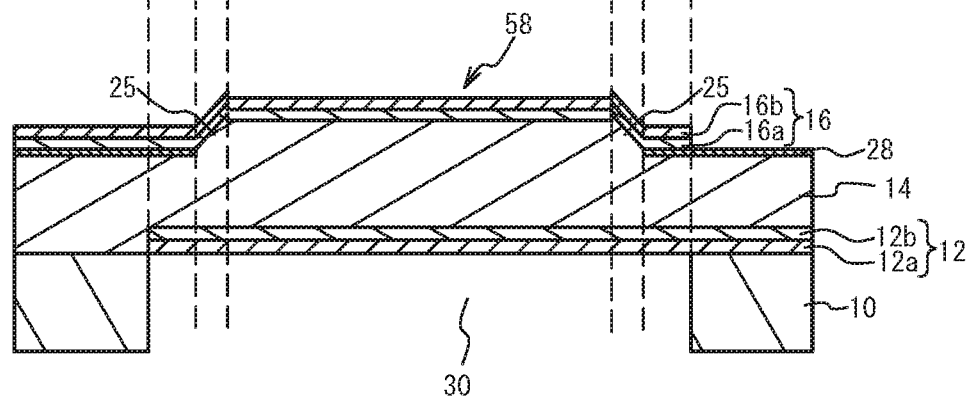

As illustrated in FIG. 5C, in the thin film region 62, the insertion film 28 is interposed between the piezoelectric film 14 and the upper electrode 16. In the step region 60, the insertion film 28 is not formed. Other structures are the same as those of the first embodiment, and the description thereof is omitted.

Figure 6A:
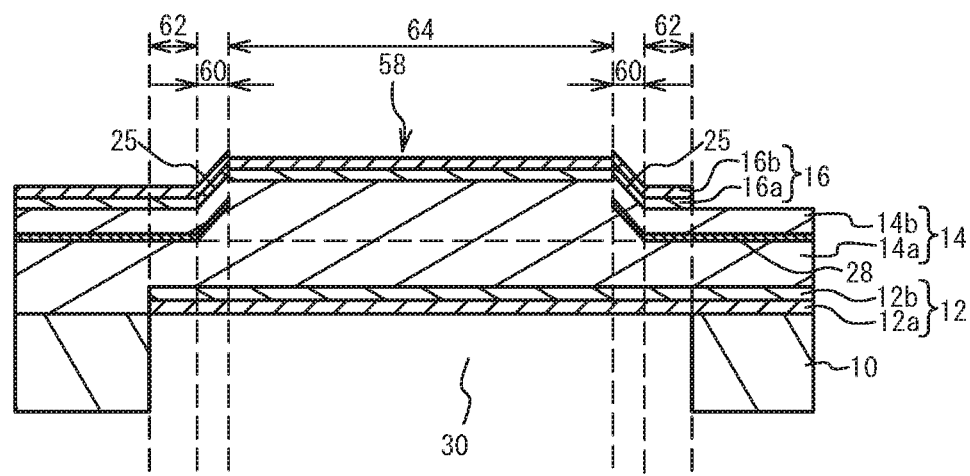
FIG. 6A and FIG. 6B are cross-sectional views around the resonance region in fourth and fifth variations of the first embodiment, respectively.

As illustrated in FIG. 6A, a step is formed on the upper surface of the lower piezoelectric film 14a. In the step region 60, the insertion film 28 is formed along the side surface of the step 25. Other structures are the same as those of the first embodiment, and the description thereof is omitted.

Figure 6B:
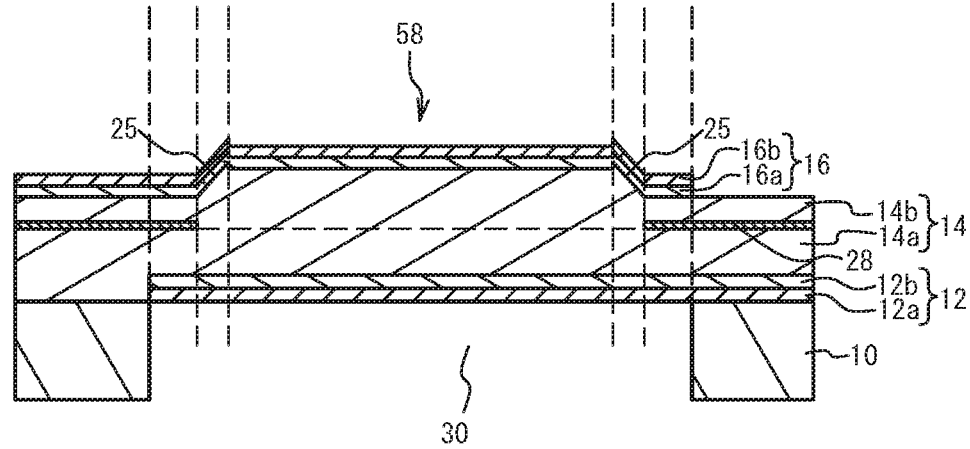

As illustrated in FIG. 6B, in the step region 60, the insertion film 28 is not formed. Other structures are the same as those of the first embodiment, and the description thereof is thus omitted.

Figure 7A:
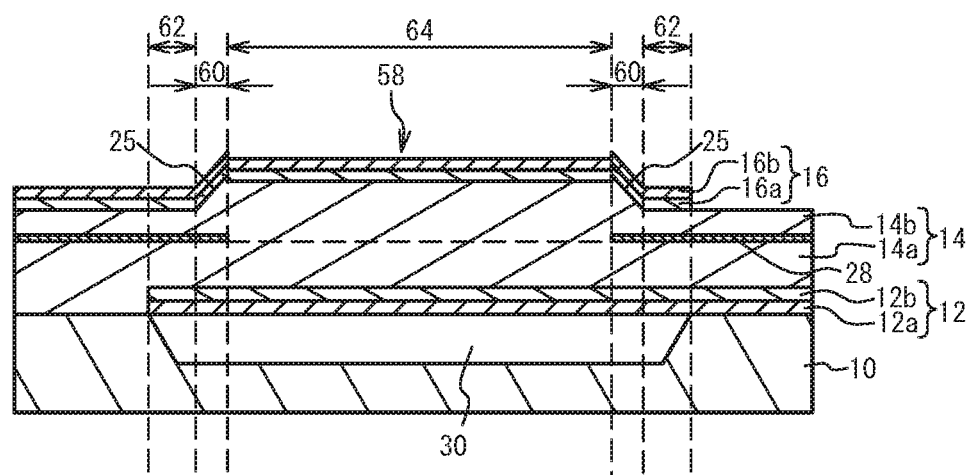
FIG. 7A and FIG. 7B are cross-sectional views around the resonance region in sixth and seventh variations of the first embodiment, respectively.
Figure 7B:
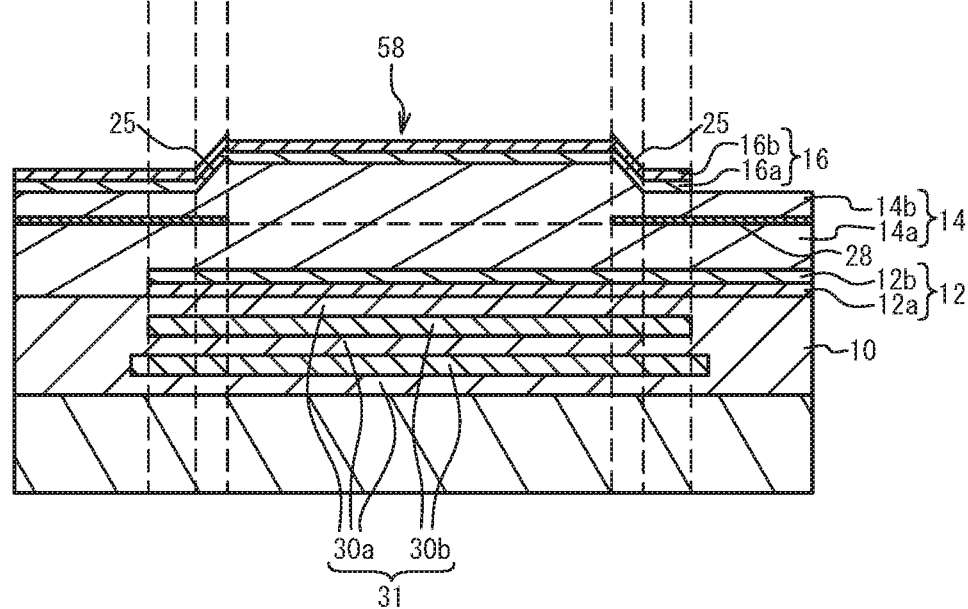

Sixth and seventh variations of the first embodiment change the structure of the air gap. FIG. 7A and FIG. 7B are cross-sectional views around the resonance region in the sixth and seventh variations of the first embodiment, respectively. As illustrated in FIG. 7A, a recess is formed on the upper surface of the substrate 10. The lower electrode 12 is flatly formed on the substrate 10. Accordingly, the air gap 30 is formed in the recess of the substrate 10. The air gap 30 is formed so as to include the resonance region 50. Other structures are the same as those of the first embodiment, and the description thereof is thus omitted. The air gap 30 may be formed so as to penetrate through the substrate 10. An insulating film may be formed so as to make contact with the lower surface of the lower electrode 12. That is, the air gap 30 may be formed between the substrate 10 and an insulating film making contact with the lower electrode 12. The insulating film may be formed of, for example, an aluminum nitride film.

As illustrated in FIG. 7B, an acoustic mirror 31 is formed under the lower electrode 12 in the resonance region 50. The acoustic mirror 31 is formed of a film 30a with low acoustic impedance and a film 30b with high acoustic impedance alternately stacked. The film thickness of each of the films 30a and 30b is, for example, λ/4 (λ is the wavelength of the acoustic wave). The staking number of the films 30a and 30b can be freely selected. For example, the acoustic mirror 31 may be formed by providing a single layer with acoustic impedance different from that of the substrate 10 in the substrate 10. Other structures are the same as those of the first embodiment, and thus the description thereof is omitted.

In the first embodiment and the first through fifth variations thereof, the air gap 30 may be formed as in the sixth variation of the first embodiment, or the acoustic mirror 31 may be formed instead of the air gap 30 as in the seventh variation of the first embodiment.

As in the first embodiment and the first through sixth variations thereof, the piezoelectric thin film resonator may be a Film Bulk Acoustic Resonator (FBAR) in which the air gap 30 is formed between the substrate 10 and the lower electrode 12 in the resonance region 50. Alternatively, as in the seventh variation of the first embodiment, the piezoelectric thin film resonator may be a Solidly Mounted Resonator (SMR) in which the acoustic mirror 31 reflecting the acoustic wave propagating through the piezoelectric film 14 is formed under the lower electrode 12 in the resonance region 50.

In the first embodiment and the variations thereof, the insertion film 28 may be interposed between the piezoelectric film 14 and the lower electrode 12. The air gap 30 or the acoustic mirror 31 is only required to be formed so as to be larger than the thick film region 64 or the central region 54 and include the thick film region 64 or the central region 54. It is only required that at least a part of the step 25 surrounding the center of the resonance region 50 is located in the resonance region 50. An exemplary case in which the resonance region 50 has an elliptical shape has been described, but the resonance region 50 may have other shapes. For example, the resonance region 50 may have a polygonal shape such as a quadrangle shape or a pentagonal shape.

In the first embodiment and the variations thereof, the effect of the insertion film 28 and the step 25 on resonance characteristics and spurious were simulated with a two-dimensional finite element method. The simulation was conducted by applying the mirror condition to the center of the resonance region 50. The materials and the film thicknesses for the simulation are as follows.

Lower layer 12a of the lower electrode 12: Cr film with a film thickness of 100 nm
Upper layer 12b of the lower electrode 12: Ru film with a film thickness of 200 nm
Piezoelectric film 14: AlN film with a film thickness T0 of 1260 nm
Lower piezoelectric film 14a: AlN film with a film thickness of 630 nm
Insertion film 28: Silicon oxide film with a film thickness of 125 nm
Upper electrode 16: Ru film with a film thickness of 230 nm
Angle θ of the end surface of the step 25: 70°
Width W0 of the resonance region 50: 42 μm
Width W2: 2 μm The simulation was conducted on samples A through F as samples of a comparative example and samples G through J as samples of the embodiment. Samples A through C are examples without the insertion film 28, and samples D through J are examples with the insertion film 28.

Figure 8A:
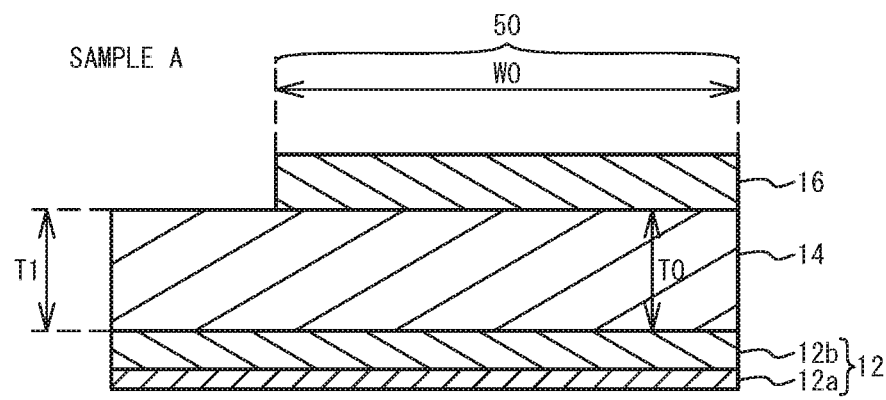
FIG. 8A through FIG. 8C are cross-sectional views of samples A through C of a comparative example, respectively.
Figure 8B:
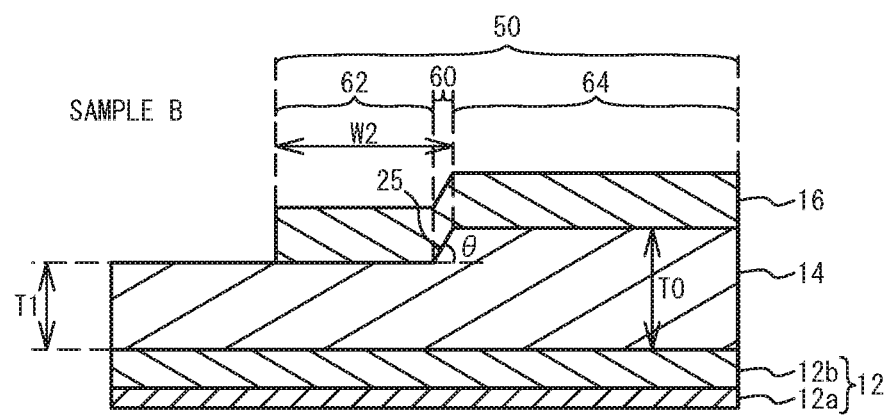
Figure 8C:
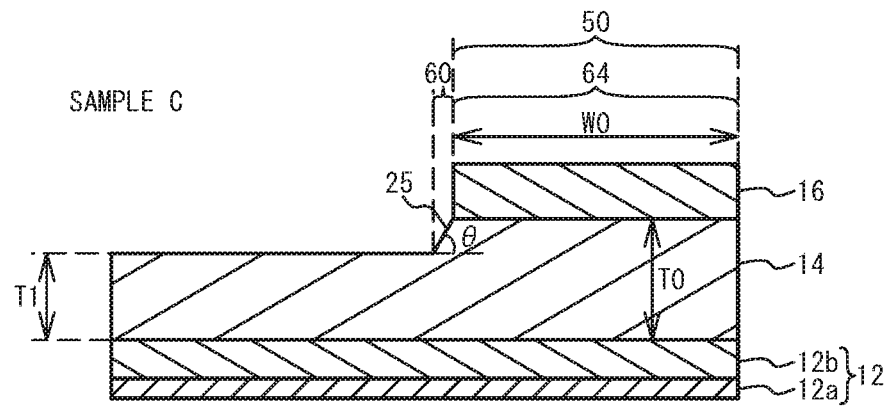

FIG. 8A through FIG. 8C are cross-sectional views of samples A through C of the comparative example, respectively. As illustrated in FIG. 8A, in sample A, the step 25 is not formed on the upper surface of the piezoelectric film 14. The insertion film 28 is not provided. The film thickness of the piezoelectric film 14 is T0 and T1 and constant. The right end of the figure corresponds to the center of the resonance region 50, and the width of the resonance region 50 is W0. The right end of the resonance region 50 corresponds to the center line of the resonance region 50. Thus, the width of the actual resonance region 50 corresponds to W0×2. The same applies to the following samples.

As illustrated in FIG. 8B, in sample B, the step 25 is formed on the upper surface of the piezoelectric film 14. The insertion film 28 is not provided. The total width of the thin film region 62 and the step region 60 is W2=2 μm. The angle between the side surface of the step 25 and the upper surface of the piezoelectric film 14 is θ=70°. The film thickness of the piezoelectric film 14 in the thin film region 62 is T1 and constant.

As illustrated in FIG. 8C, in sample C, the upper electrode 16 is not formed in the region corresponding to the thin film region 62 and the step region 60 in sample B. Accordingly, the resonance region 50 coincides with the thick film region 64. Other structures are the same as those of sample B, and the description thereof is thus omitted.

Figure 9A:
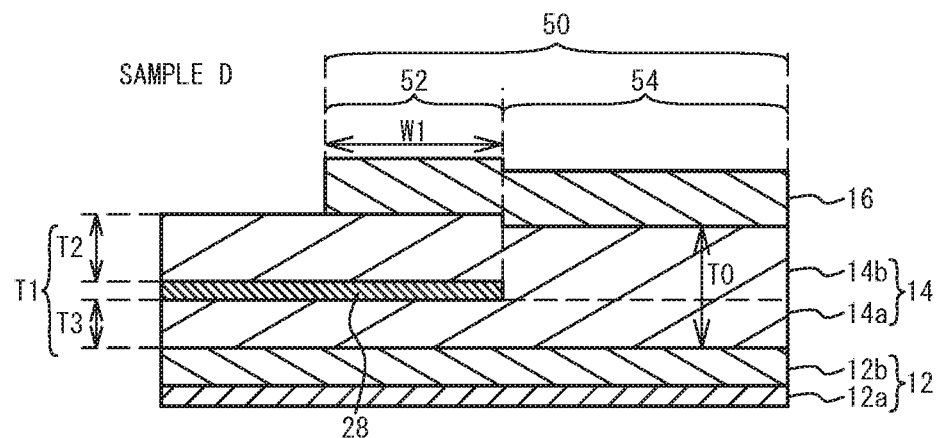
FIG. 9A through FIG. 9C are cross-sectional views of samples D through F of the comparative example, respectively.
Figure 9B:
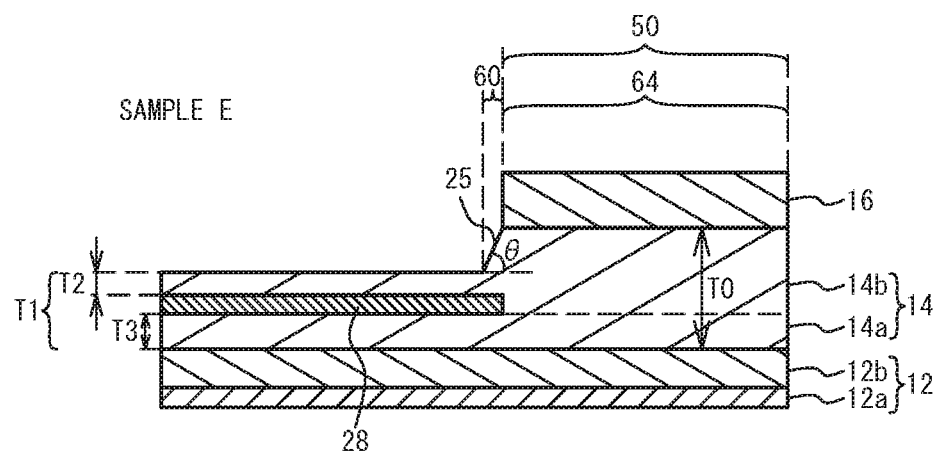
Figure 9C:
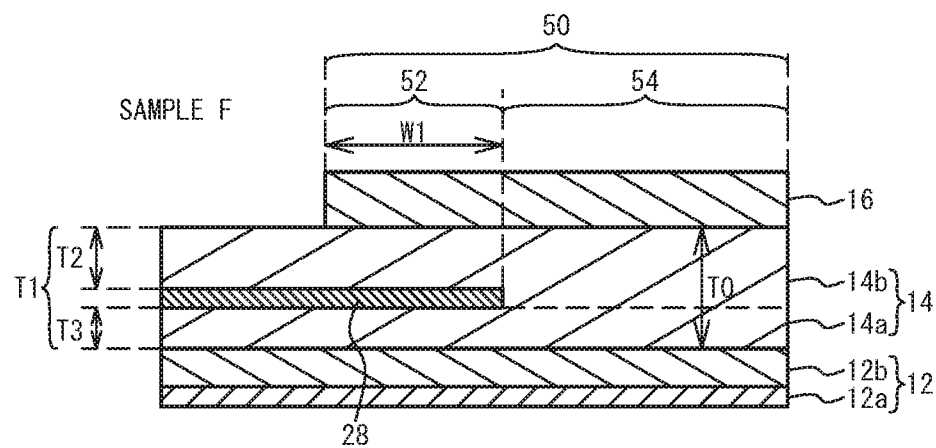

FIG. 9A through FIG. 9C are cross-sectional views of samples D through F of the comparative example, respectively. As illustrated in FIG. 9A, sample D has a structure in which the insertion film 28 is inserted in the piezoelectric film 14 of sample A. The insertion film 28 is located in the piezoelectric film 14 in the outer peripheral region 52 of the resonance region 50. The insertion width (the width of the outer peripheral region 52) of the insertion film 28 is W1. The film thickness T1 of the piezoelectric film 14 in the outer peripheral region 52 is equal to the sum of the film thickness T3 of the lower piezoelectric film 14a and the film thickness T2 of the upper piezoelectric film 14b. Formed on the upper surface of the piezoelectric film 14 between the outer peripheral region 52 and the central region 54 is a step corresponding to the film thickness of the insertion film 28. Accordingly, T1=T0. Other structures are the same as those of sample A, and the description thereof is thus omitted.

As illustrated in FIG. 9B, sample E has a structure in which the insertion film 28 is inserted in the piezoelectric film 14 of sample C. The insertion film 28 is located in the region corresponding to the thin film region 62 and the step region 60 in sample C, but is not located in the thick film region 64 in sample C. Accordingly, the insertion film 28 is not located in the resonance region 50. The film thickness T1 of the piezoelectric film 14 in the region corresponding to the thin film region 62 is equal to the sum of the film thickness T3 of the lower piezoelectric film 14a and the film thickness T2 of the upper piezoelectric film 14b. Other structures are the same as those of sample C, and thus the description thereof is thus omitted.

As illustrated in FIG. 9C, in sample F, the film thickness of the upper piezoelectric film 14b in the outer peripheral region 52 is thinner by the film thickness of the insertion film 28, and thus the upper surface of the piezoelectric film 14 is flat. Accordingly, the film thickness T1 of the piezoelectric film 14 in the thin film region 62 is thinner than the film thickness T0 by the film thickness of the insertion film 28. Other structures are the same as those of sample D, and the description thereof is thus omitted.

Figure 10A:
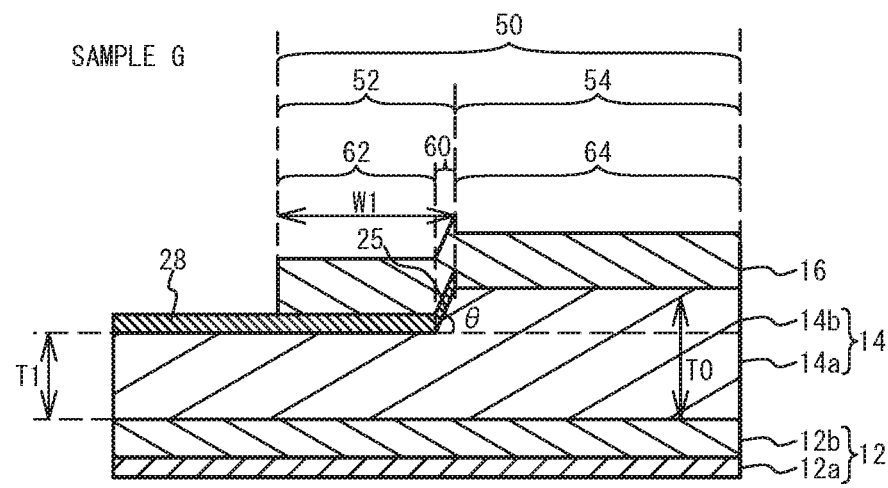
FIG. 10A and FIG. 10B are cross-sectional views of samples G and H of the first embodiment, respectively.
Figure 10B:
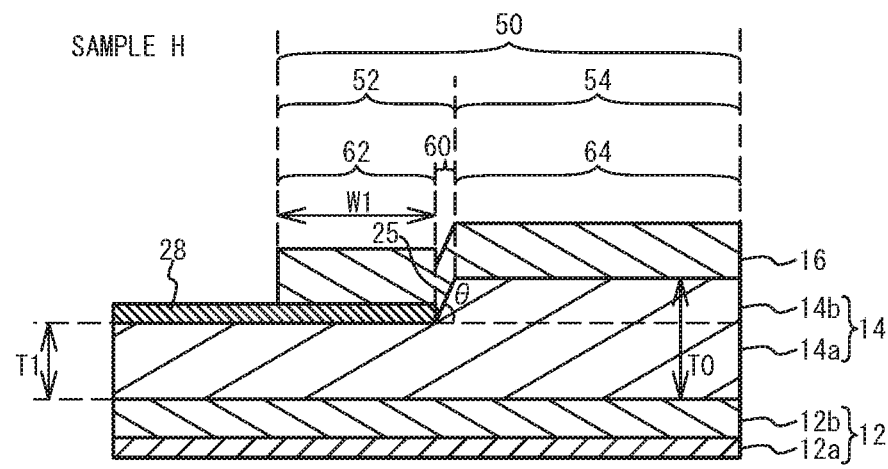

FIG. 10A and FIG. 10B are cross-sectional views of samples G and H of the first embodiment, respectively. As illustrated in FIG. 10A, in sample G, the upper surface of the piezoelectric film 14 has the step 25. The insertion film 28 makes contact with the upper surface of the piezoelectric film 14 in the thin film region 62 and the side surface of the piezoelectric film 14 in the step region 60. Therefore, the insertion width W1 is the sum of the width of the thin film region 62 and the width of the step region 60. The insertion film 28 is not located in the thick film region 64. The angle between the side surface of the step 25 and the upper surface in the thin film region 62 is θ=70°.

As illustrated in FIG. 10B, in sample H, the insertion film 28 is not located in the step region 60. Thus, the insertion width W1 is equal to the width of the thin film region 62. Other structures are the same as those of sample G, and the description thereof is thus omitted.

Figure 11A:
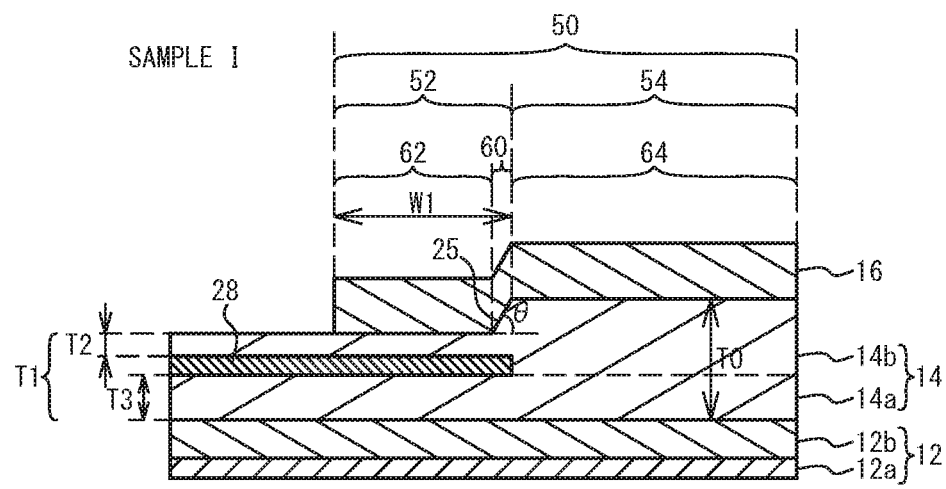
FIG. 11A and FIG. 11B are cross-sectional views of samples I and J of the first embodiment, respectively.
Figure 11B:
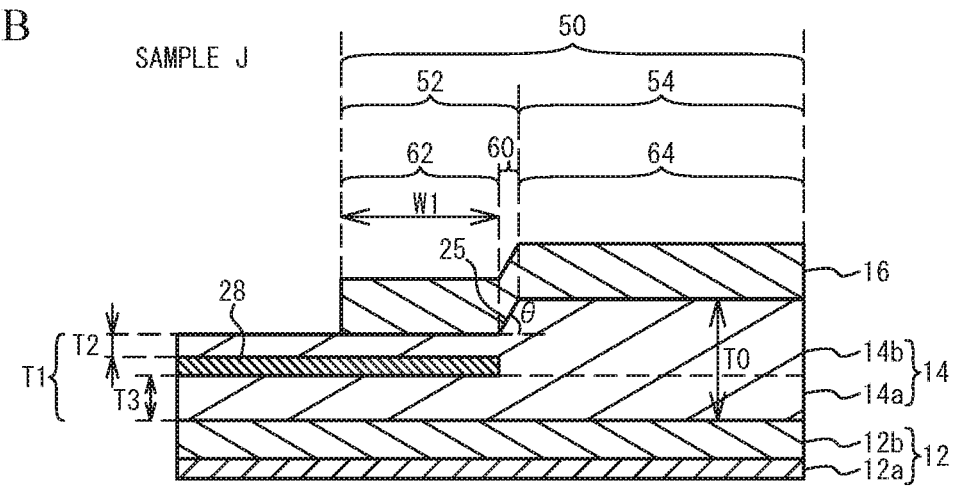

FIG. 11A and FIG. 11B are cross-sectional views of samples I and J of the first embodiment. As illustrated in FIG. 11A, in sample I, the insertion film 28 is inserted in the piezoelectric film 14. The insertion film 28 in the step region 60 is not slanted. The film thickness T1 of the piezoelectric film 14 in the thin film region 62 is equal to the sum of the film thickness T3 of the lower piezoelectric film 14a and the film thickness T2 of the upper piezoelectric film 14b. Other structures are the same as those of sample G, and the description thereof is omitted.

As illustrated in FIG. 11B, in sample J, the insertion film 28 is not located in the step region 60. Therefore, the insertion width W1 is equal to the width of the thin film region 62. Other structures are the same as those of sample I, and the description thereof is thus omitted.

Figure 12:
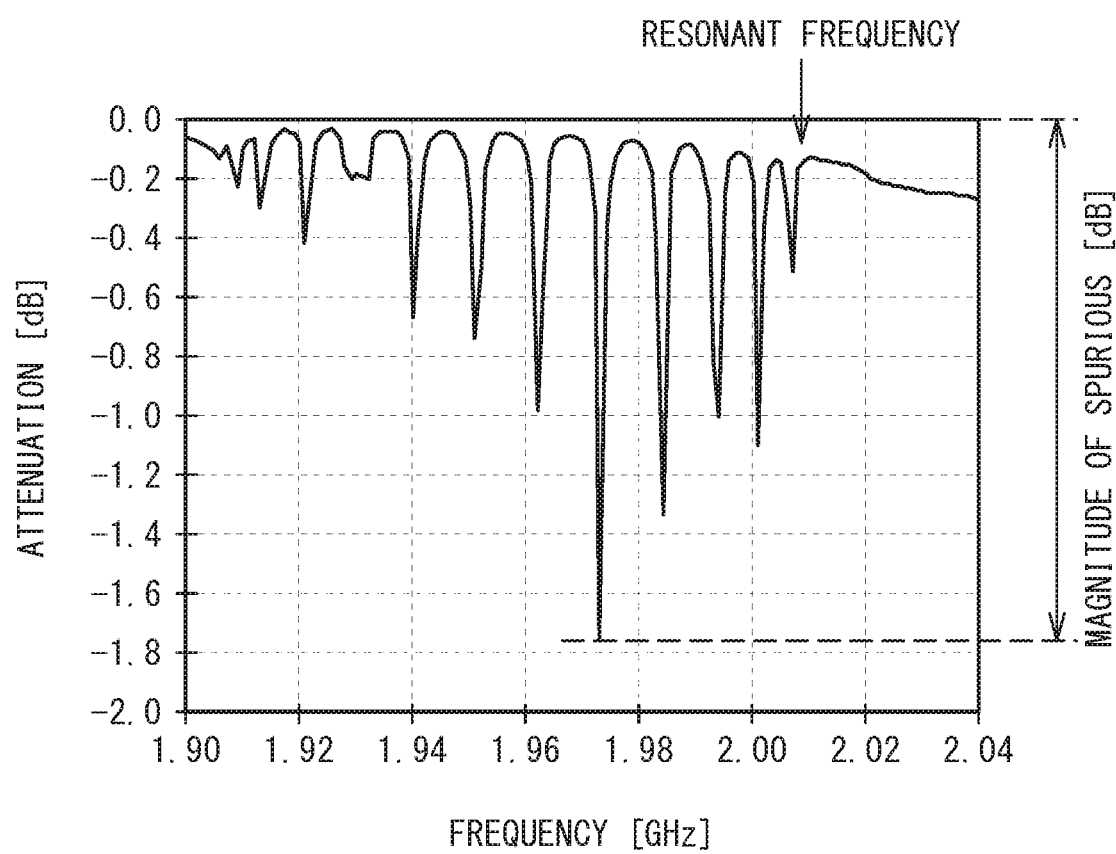
FIG. 12 illustrates the definition of the magnitude of spurious.

FIG. 12 illustrates the definition of the magnitude of spurious. As illustrated in FIG. 12, for each sample, the pass characteristic of the piezoelectric thin film resonator was simulated. The magnitude of spurious is defined as the attenuation at the frequency that is lower than the resonant frequency and at which spurious is largest.

FIG. 13 illustrates the film thickness T1 of the piezoelectric film, the insertion width W1, the magnitude of spurious, and the Q-value at the antiresonant frequency of each sample. As illustrated in FIG. 13, in sample A, the Q-value is approximately 700, and spurious is approximately −1. As shown by sample B, even when the step 25 is formed in the resonance region 50, the Q-value does not change. Spurious decreases a little. As shown by sample C, when the step 25 is formed outside the resonance region 50, the Q-value increases. Spurious remains unchanged.

As shown by samples D and F, when the insertion film 28 is located in the outer peripheral region 52, the Q-value is drastically improved, more than twice the Q-value of sample A. However, spurious deteriorates more than spurious of sample A. As shown by sample E, when the step 25 is located outside the resonance region 50, the Q-value is higher than that of sample A, but approximately the same as that of sample C. Spurious is approximately the same as those of samples D and F.

As shown by samples G through J, when the insertion film 28 is located in the resonance region 50 and the step 25 is provided, in most of samples, the Q-value is more than three times greater than the Q-value of sample A. In addition, in most of samples G through J, the Q-value is improved compared to samples D and F in which the step 25 is not provided and the insertion film 28 is provided. In most of samples G through J, spurious is approximately less than half of sample A. In most of samples G through J, spurious is reduced more than that of sample B in which the step 25 is located but the insertion film 28 is not located in the resonance region 50. As described above, in samples G through J, the Q-value improves and the spurious is reduced more than expected from samples B, D, and F.

In samples A through F in accordance with the comparative example, the Q-value is in a trade-off relationship with spurious, and even in samples G through J in accordance with the embodiment, the Q-value is in a trade-off relationship with spurious. However, when samples G through J have a Q-value approximately equal to those of samples A through F, spurious is greatly reduced. In addition, when samples G through J have spurious approximately the same as those of samples A through F, the Q-value is greatly increased. In samples G through J, the Q-value can be made to be approximately three times of the Q-value of sample A and the magnitude of spurious can be made to be less than half of that of sample A.

It is unknown why the Q-value increases and spurious is reduced in samples G through I as described above, but it may be considered that since the acoustic wave leaking from the resonance region 50 in the lateral direction is reflected by the insertion film 28 and the step 25, the acoustic wave energy thus does not leak from the resonance region 50, and the Q-value therefore increases. In addition, it is considered that since the acoustic wave propagating in the lateral direction is reflected by the insertion films 28 and the side surface of the step 25, spurious is therefore reduced.

In the first embodiment and the variations thereof, the piezoelectric film 14 has the step 25 on the upper surface thereof, the film thickness T0 of the piezoelectric film 14 inside the step 25 being greater than the film thickness T1 of the piezoelectric film 14 outside the step 25. The resonance region 50 includes the step 25 in plan view. Provided is the insertion film 28 that is located in at least a part of the outer peripheral region 52 in the resonance region 50, and is not located in the central region 54 of the resonance region 50. This structure can improve the Q-value and reduce spurious.

In addition, as in samples G through J, the side surface of the step 25 is slanted. This structure causes the acoustic wave propagating in the lateral direction to be reflected in an oblique direction. Therefore, it is considered that the standing wave of the acoustic wave propagating in the lateral direction becomes difficult to exist in the resonance region 50. Accordingly, spurious is further reduced.

The insertion film 28 may overlap with the thick film region 64. As in samples G through J, the insertion film 28 preferably does not overlap with the thick film region 64 (inside the step 25) in plan view. This structure causes the acoustic wave propagating in the lateral direction to be reflected by the side surface of the step 25 at the same time or before reflected by the edge portion of the insertion film 28. Accordingly, the Q-value further increases, and spurious is further reduced.

Furthermore, the insertion film 28 preferably does not overlap with the step region 60 (the step 25) or the thick film region 64 in plan view. This structure causes the acoustic wave propagating in the lateral direction to be reflected by the side surface of the step 25 before reflected by the edge portion of the insertion film 28. Therefore, the Q-value further increases, and spurious is further reduced.

As in samples H through J, the upper electrode 16 makes contact with the side surface of the step 25. Accordingly, when spurious is approximately equal to that of sample G, the Q-value can be improved. The reason of this is considered to be that since the upper electrode 16 makes contact with the side surface of the step 25, the acoustic wave propagating in the lateral direction is further reflected.

As in samples I and J, the insertion film 28 is located between the lower piezoelectric film 14a and the upper piezoelectric film 14b. This structure can increase the Q-value when spurious is approximately the same as those of samples G through H.

As in samples G and H, the insertion film 28 may be located between the piezoelectric film 14 and the upper electrode 16. The insertion film 28 may be located between the piezoelectric film 14 and the lower electrode 12.

As in sample G, the insertion film 28 preferably makes contact with the side surface of the step 25, and the upper electrode 16 is preferably located beside the side surface of the step 25. For example, as illustrated in FIG. 10A, the upper electrode 16 is located beside the step 25 across the insertion film 28 in the horizontal direction. This structure can reduce spurious and increase the Q-value.

Second Embodiment

Figure 14A:
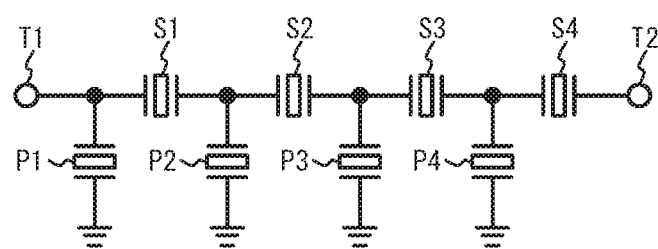
FIG. 14A is a circuit diagram of a filter in accordance with a second embodiment.
Figure 14B:
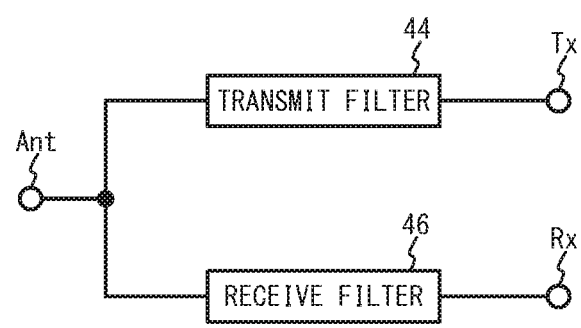
FIG. 14B is a circuit diagram of a duplexer in accordance with a variation of the second embodiment.

A second embodiment is an exemplary filter and an exemplary duplexer using the piezoelectric thin film resonator according to any one of the first embodiment and the variations thereof. FIG. 14A is a circuit diagram of a filter in accordance with the second embodiment, and FIG. 14B is a circuit diagram of a duplexer in accordance with a variation of the second embodiment. As illustrated in FIG. 14A, one or more series resonators S1 through S4 are connected in series between an input terminal T1 and an output terminal T2.

One or more parallel resonators P1 through P4 are connected in parallel between the input terminal T1 and the output terminal T2. At least one of the one or more series resonators S1 through S4 and the one or more parallel resonators P1 through P4 may be the acoustic wave resonator in accordance with any one of the first embodiment and the variations thereof. The number of resonators in a ladder-type filter can be appropriately selected. A filter including the acoustic wave resonators according to any one of the first embodiment and the variations thereof may be a multimode filter as well as a ladder-type filter.

As illustrated in FIG. 14B, a transmit filter 44 is connected between a common terminal Ant and a transmit terminal Tx. A receive filter 46 is connected between the common terminal Ant and a receive terminal Rx. The transmit filter 44 transmits signals in the transmit band to the common terminal Ant as transmission signals among signals input from the transmit terminal Tx, and suppresses signals with other frequencies. The receive filter 46 transmits signals in the receive band to the receive terminal Rx as reception signals among signals input from the common terminal Ant, and suppresses signals with other frequencies. At least one of the transmit filter 44 or the receive filter 46 can be the filter of the second embodiment.

The filter includes the piezoelectric thin film resonator according to any one of the first embodiment and the variations thereof. Accordingly, the Q-value of the resonator increases, and the skirt characteristics of the filter can be improved. In addition, ripples due to spurious can be reduced.

At least one of the transmit filter 44 or the receive filter 46 can be a filter including the piezoelectric thin film resonator according to any one of the first embodiment and the variations thereof.

Although the embodiments of the present invention have been described in detail, it is to be understood that the various change, substitutions, and alterations could be made hereto without departing from the spirit and scope of the invention.

What is claimed is:
1. A piezoelectric thin film resonator comprising:
a substrate;
a lower electrode located on the substrate;
a piezoelectric film that has a step on an upper surface thereof and is located on the lower electrode, a film thickness of the piezoelectric film inside the step being greater than a film thickness of the piezoelectric film outside the step;
an upper electrode that is located on the piezoelectric film so that a resonance region is formed, the lower electrode and the upper electrode facing each other across the piezoelectric film in the resonance region, the resonance region including the step in plan view; and an insertion film that is located in the piezoelectric film, or between the piezoelectric film and the lower electrode in at least a part of a thin film region located further out than the step in plan view within the resonance region, and is not located in a thick film region located further in than the step in plan view within the resonance region, wherein a side surface of the step is slanted, and wherein a thickness of the insertion film is smaller than a difference between a thickness of the piezoelectric film in the thick film region and a thickness of the piezoelectric film in the thin film region.

2. The piezoelectric thin film resonator according to claim 1, wherein
the insertion film does not overlap with the step in plan view.

3. The piezoelectric thin film resonator according to claim 1, wherein
the upper electrode makes contact with a side surface of the step.

4. The piezoelectric thin film resonator according to claim 1, wherein
the piezoelectric film in the thin film region includes a lower piezoelectric film and an upper piezoelectric film, and
the insertion film is located between the lower piezoelectric film and the upper piezoelectric film.

5. The piezoelectric thin film resonator according to claim 1, wherein
the insertion film has an acoustic impedance less than an acoustic impedance of the piezoelectric film.

6. The piezoelectric thin film resonator according to claim 1, wherein
an air layer is located under the lower electrode in the resonance region.

7. The piezoelectric thin film resonator according to claim 1, wherein
an acoustic mirror configured to reflect an acoustic wave propagating through the piezoelectric film is located under the lower electrode in the resonance region.

8. A piezoelectric thin film resonator comprising:
a substrate;
a lower electrode located on the substrate;
a piezoelectric film that has a step on an upper surface thereof and is located on the lower electrode, a film thickness of the piezoelectric film inside the step being greater than a film thickness of the piezoelectric film outside the step;
an upper electrode that is located on the piezoelectric film so that a resonance region is formed, the lower electrode and the upper electrode facing each other across the piezoelectric film in the resonance region, the resonance region including the step in plan view; and an insertion film that is located between the piezoelectric film and the upper electrode in at least a part of a thin film region located further out than the step in plan view within the resonance region, and is not located in a thick film region located further in than the step in plan view within the resonance region, wherein a thickness of the insertion film is smaller than a difference between a thickness of the piezoelectric film in the thick film region and a thickness of the piezoelectric film in the thin film region.

9. The piezoelectric thin film resonator according to claim 8, wherein
the insertion film makes contact with a side surface of the step, and the upper electrode is located beside the side surface of the step.

10. The piezoelectric thin film resonator according to claim 8, wherein a side surface of the step is slanted.

11. The piezoelectric thin film resonator according to claim 10, wherein the insertion film does not overlap with the step in plan view.

12. A filter comprising:
the piezoelectric thin film resonator according to claim 8.

13. A duplexer comprising:
the filter according to claim 12.

14. A filter comprising:
a piezoelectric thin film resonator including:
a substrate;
a lower electrode located on the substrate;
a piezoelectric film that has a step on an upper surface thereof and is located on the lower electrode, a film thickness of the piezoelectric film inside the step being greater than a film thickness of the piezoelectric film outside the step;
an upper electrode that is located on the piezoelectric film so that a resonance region is formed, the lower electrode and the upper electrode facing each other across the piezoelectric film in the resonance region, the resonance region including the step in plan view; and
an insertion film that is located in the piezoelectric film, or between the piezoelectric film and the lower electrode in at least a part of a thin film region located further out than the step in plan view within the resonance region, and is not located in a thick film region located further in than the step in plan view within the resonance region, wherein a side surface of the step is slanted, and wherein a thickness of the insertion film is smaller than a difference between a thickness of the piezoelectric film in the thick film region and a thickness of the piezoelectric film in the thin film region.

15. A duplexer comprising:
the filter according to claim 14.

* * * * *